United States Patent
Liao et al.

(10) Patent No.: US 10,359,796 B1
(45) Date of Patent: Jul. 23, 2019

(54) BUFFER CIRCUIT FOR ENHANCING BANDWIDTH OF VOLTAGE REGULATOR AND VOLTAGE REGULATOR USING THE SAME

(71) Applicant: NOVATEK Microelectronics Corp., Hsin-Chu (TW)

(72) Inventors: Jie-Yu Liao, Hsinchu County (TW); Chun-Hung Chen, Yun-Lin County (TW); Hsueh-Yi Lee, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/221,608

(22) Filed: Dec. 17, 2018

(51) Int. Cl.
| | | |
|---|---|---|
| *G05F 1/563* | (2006.01) | |
| *G05F 1/63* | (2006.01) | |
| *G05F 1/575* | (2006.01) | |
| *H03F 1/30* | (2006.01) | |
| *H02M 1/15* | (2006.01) | |

(52) U.S. Cl.
CPC ............... *G05F 1/63* (2013.01); *G05F 1/575* (2013.01); *H02M 1/15* (2013.01); *H03F 1/30* (2013.01)

(58) Field of Classification Search
CPC ............ G05F 1/56; G05F 1/563; H02M 1/15; H02M 1/575; H03K 1/40
USPC ....... 323/266, 268, 273, 274, 280, 281, 312, 323/315; 327/336, 552, 553, 540, 542, 327/561, 563
See application file for complete search history.

(56) References Cited

U.S. PATENT DOCUMENTS

| | | | | | |
|---|---|---|---|---|---|
| 5,734,294 | A | * | 3/1998 | Bezzam | H03F 3/45479 327/103 |
| 7,656,224 | B2 | * | 2/2010 | Perez | H03F 1/0261 323/282 |
| 7,821,240 | B2 | * | 10/2010 | Oddoart | G05F 1/565 323/269 |
| 8,080,983 | B2 | * | 12/2011 | Lourens | G05F 1/575 323/275 |
| 9,354,649 | B2 | * | 5/2016 | Ho | G05F 1/575 |

* cited by examiner

*Primary Examiner* — Rajnikant B Patel
(74) *Attorney, Agent, or Firm* — Winston Hsu (57) ABSTRACT

A buffer circuit includes a first transistor, a second transistor, a feed-forward circuit and a resistive bias circuit. The first transistor has a first terminal, a second terminal and a third terminal, wherein the first terminal of the first transistor is served as an input terminal of the buffer circuit. The second transistor has a first terminal and a second terminal, wherein the second terminal of the second transistor is coupled to the third terminal of the first transistor and served as an output terminal of the buffer circuit. The feed-forward circuit has a first terminal and a second terminal respectively coupled to the first terminal of the second transistor and the second terminal of the first transistor. The resistive bias circuit has a first terminal and a second terminal respectively coupled to the second terminal of the first transistor and the first terminal of the feed-forward circuit.

20 Claims, 12 Drawing Sheets

BUFFER CIRCUIT FOR ENHANCING BANDWIDTH OF VOLTAGE REGULATOR AND VOLTAGE REGULATOR USING THE SAME

BACKGROUND OF THE INVENTION

1. Field of the Invention

The present invention relates to a buffer circuit used for a voltage regulator, and more particularly, to a buffer circuit implemented as a source follower for controlling the power transistor of a voltage regulator.

2. Description of the Prior Art

A voltage regulator is widely used in an integrated circuit (IC). With the benefit of small ripples in the supply voltage of the voltage regulator, the voltage regulator is usually applied to supply stable power for operations of the circuit. However, if the load circuit of the voltage regulator draws a current rapidly under high speed operations, a large voltage drop may appear on the output voltage of the voltage regulator, resulting in abnormal operations of the load circuit.

In order to solve this problem, an off-chip capacitor is usually disposed to stabilize the output voltage of the voltage regulator. However, the off-chip capacitor occupies a large area, which requires high system costs and also generates adverse impacts on the small form factor. Also, the regulation efficiency of the off-chip capacitor is highly affected by the bump resistance on the pad connected between the voltage regulator and the off-chip capacitor. Therefore, with continuous increasing of functionality, complexity and power consumption of the IC, the voltage regulator should be capable of rapidly providing currents for the load circuit.

There are several currently available methods for increasing the operation speed of the voltage regulator, such as spike coupling and bandwidth increasing. The spike coupling method is realized by coupling the voltage drop to another circuit, which generates an inverted feedback signal on the gate of the power transistor to recover the voltage drop. Although the spike coupling technique can reduce the voltage drop, the settling time of the output voltage is still determined by the bandwidth of the voltage regulator, and the coupling of the voltage drop signal may result in output oscillation and electromagnetic interference (EMI) problems. The bandwidth increasing method is usually accompanied by reduced stability, since the phase margin will decrease with the increasing bandwidth.

Thus, there is a need to provide a novel scheme for enhancing the bandwidth of the voltage regulator while the phase margin and stability still keep at a satisfactory level.

SUMMARY OF THE INVENTION

It is therefore an objective of the present invention to provide a buffer circuit which is capable of enhancing the bandwidth of the voltage regulator while maintaining the stability of the voltage regulator.

An embodiment of the present invention discloses a buffer circuit, which comprises a first transistor, a second transistor, a feed-forward circuit and a resistive bias circuit. The first transistor has a first terminal, a second terminal and a third terminal, wherein the first terminal of the first transistor is served as an input terminal of the buffer circuit. The second transistor has a first terminal and a second terminal, wherein the second terminal of the second transistor is coupled to the third terminal of the first transistor and served as an output terminal of the buffer circuit. The feed-forward circuit has a first terminal and a second terminal, wherein the first terminal of the feed-forward circuit is coupled to the first terminal of the second transistor, and the second terminal of the feed-forward circuit is coupled to the second terminal of the first transistor. The resistive bias circuit has a first terminal and a second terminal, wherein the first terminal of the resistive bias circuit is coupled to the second terminal of the first transistor, and the second terminal of the resistive bias circuit is coupled to the first terminal of the feed-forward circuit.

Another embodiment of the present invention discloses a voltage regulator, which comprises a power transistor, a voltage divider, an operational amplifier and a buffer circuit. The voltage divider is coupled to the power transistor. The operational amplifier is coupled to the voltage divider. The buffer circuit, coupled between an output terminal of the operational amplifier and a gate terminal of the power transistor, comprises a first transistor, a second transistor, a feed-forward circuit and a resistive bias circuit. The first transistor has a first terminal, a second terminal and a third terminal, wherein the first terminal of the first transistor is coupled to the output terminal of the operational amplifier. The second transistor has a first terminal and a second terminal, wherein the second terminal of the second transistor is coupled to the third terminal of the first transistor and the gate terminal of the power transistor. The feed-forward circuit has a first terminal and a second terminal, wherein the first terminal of the feed-forward circuit is coupled to the first terminal of the second transistor, and the second terminal of the feed-forward circuit is coupled to the second terminal of the first transistor. The resistive bias circuit has a first terminal and a second terminal, wherein the first terminal of the resistive bias circuit is coupled to the second terminal of the first transistor, and the second terminal of the resistive bias circuit is coupled to the first terminal of the feed-forward circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
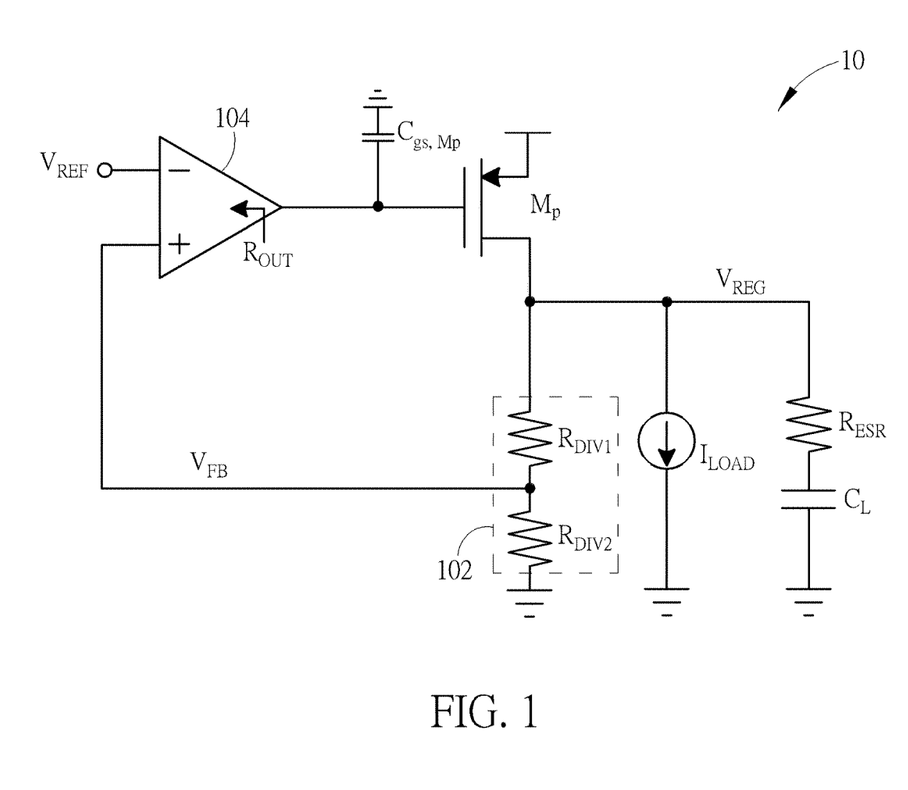
FIG. 1 is a schematic diagram of a voltage regulator.

Please refer to FIG. 1, which is a schematic diagram of a voltage regulator 10. As shown in FIG. 1, the voltage regulator 10 includes a power metal-oxide semiconductor field-effect transistor (power MOSFET) $M_p$, a voltage divider 102 and an operational amplifier 104. The power MOSFET $M_p$ receives an input voltage to generate a supply voltage $V_{REG}$. The voltage divider 102 includes resistors $R_{DIV1}$ and $R_{DIV2}$, for dividing the supply voltage $V_{REG}$ to generate a feedback voltage $V_{FB}$. Each resistor $R_{DIV1}$ or $R_{DIV2}$ may be a single resistor or a combination of multiple resistors in a resistor ladder. In another embodiment, the voltage divider 102 may be implemented with diodes and/or diode-connected transistors, or any circuit elements capable of generating equivalent resistance. The operational amplifier 104 then receives the feedback voltage $V_{FB}$ and a reference voltage $V_{REF1}$, and thereby generates a gate control signal to control the power MOSFET $M_p$ to turn on, so as to control the level of the supply voltage $V_{REG}$. In order to enhance the stability, the voltage regulator 10 may further include an off-chip capacitor $C_L$ coupled to its output terminal, where an equivalent series resistor $R_{ESR}$ usually accompanied with the off-chip capacitor $C_L$ is also illustrated. In addition, the current source $I_{LOAD}$ refers to a load circuit which receives power supply from the voltage regulator 10 and draws currents from the power MOSFET $M_p$.

Regarding the frequency response analysis of the voltage regulator 10, the off-chip capacitor $C_L$ usually has a large capacitance, which generates a dominant pole at the output terminal of the voltage regulator 10. In addition, in order to supply enough currents, the size of the power MOSFET $M_p$ is quite large; hence, there is a large parasitic capacitance $C_{gs,Mp}$ existing in the gate terminal of the power MOSFET $M_p$. Also, the operational amplifier 104 usually has large output impedance $R_{OUT}$. The combination of the large parasitic capacitance $C_{gs,Mp}$ and the large output impedance $R_{OUT}$ generates a non-dominant pole having a lower frequency at the gate terminal of the power MOSFET $M_p$. With the two low frequency poles, the closed-loop bandwidth of the voltage regulator 10 is very limited.

Figure 2:
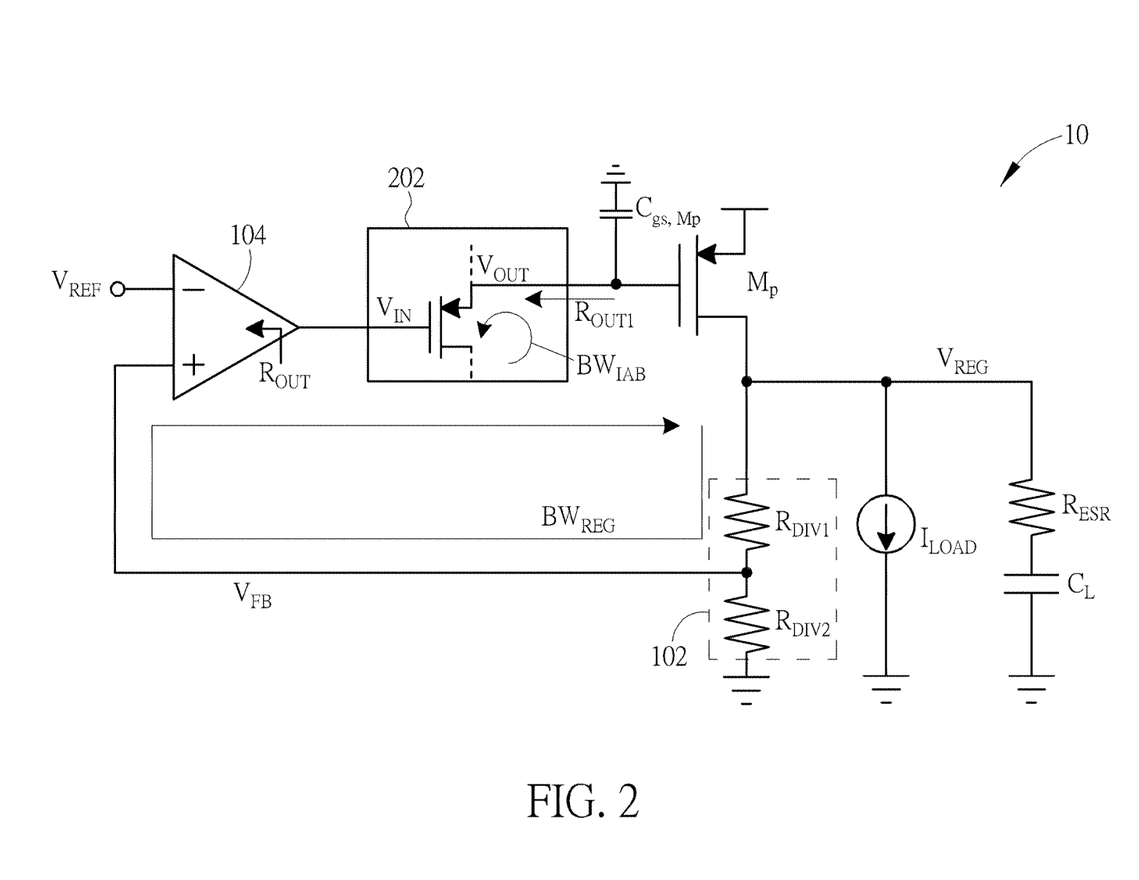
FIG. 2 is a schematic diagram of the voltage regulator with a source follower allocated between the operational amplifier and the power MOSFET.

In order to solve the above problem, a source follower 202 may be allocated between the operational amplifier 104 and the power MOSFET $M_p$, as shown in FIG. 2. The source follower 202 outputs an output voltage $V_{OUT}$ to the gate of the power MOSFET $M_p$ by following an input voltage $V_{IN}$ from the operational amplifier 104. With the source follower 202, the non-dominant pole at the gate terminal of the power MOSFET $M_p$ is determined by the output impedance $R_{OUT1}$ rather than $R_{OUT}$. Since the source follower 202 outputs the output voltage $V_{OUT}$ from the source terminal of the transistor, the value of the output impedance $R_{OUT1}$ is quite smaller than the value of the output impedance $R_{OUT}$ of the operational amplifier 104. This pushes the non-dominant pole at the gate terminal of the power MOSFET $M_p$ to a higher frequency. In other words, since the output impedance $R_{OUT1}$ of the source follower 202 is smaller, the speed of charging/discharging the gate terminal of the power MOSFET $M_p$ becomes faster. Therefore, the voltage regulator 10 may obtain a higher closed-loop bandwidth $BW_{REG}$ without decreasing the stability.

Figure 3:
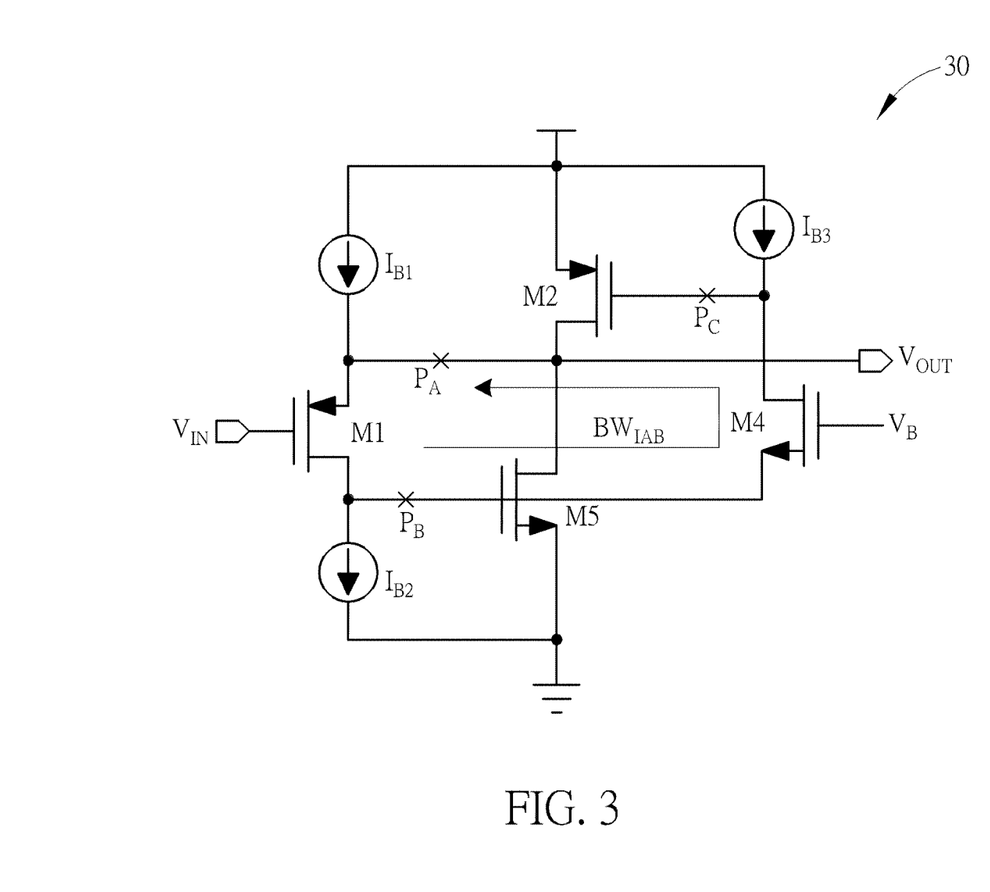
FIG. 3 is a schematic diagram of an impedance attenuated buffer.

The source follower 202 may be implemented with an impedance attenuated buffer 30 as shown in FIG. 3. The impedance attenuated buffer 30 includes transistors M1, M2, M4 and M5, and current sources $I_{B1}$, $I_{B2}$ and $I_{B3}$. The input voltage $V_{IN}$ is received via the gate terminal of the transistor M1, and the output voltage $V_{OUT}$ is outputted via the drain terminal of the transistor M2. Also, a bias voltage $V_B$ is received by the transistor M4. In the impedance attenuated buffer 30, the input signal passes through the loop formed by the transistors M1, M5, M4 and M2 to generate the output signal, where the stability of the closed-loop bandwidth $BW_{IAB}$ should be considered. Also, the incorporation of the closed-loop bandwidth $BW_{IAB}$ of the impedance attenuated buffer 30 and the closed-loop bandwidth $BW_{REG}$ of the voltage regulator 10 should also be considered if the impedance attenuated buffer 30 is included in the voltage regulator 10.

In general, since the impedance attenuated buffer 30 is incorporated in the loop of the voltage regulator 10, the poles and zeros generated from the impedance attenuated buffer 30 should be included in consideration of the stability of the voltage regulator 10, and this complicates the frequency response analysis of the voltage regulator 10. In order to prevent the loop of the voltage regulator 10 from being influenced by the local loop of the impedance attenuated buffer 30, the response speed of the impedance attenuated buffer 30 should be significantly faster than the response speed of the entire voltage regulator 10. Otherwise, the impedance attenuated buffer 30 may contribute several poles and zeros which influence the stability of the whole loop. In such a situation, the circuit design is required to meet a criterion that the closed-loop bandwidth $BW_{IAB}$ should be at least 4 times greater than the closed-loop bandwidth $BW_{REG}$, in order to prevent the operations of the impedance attenuated buffer 30 from influencing the frequency response of the voltage regulator 10.

Figure 4A:
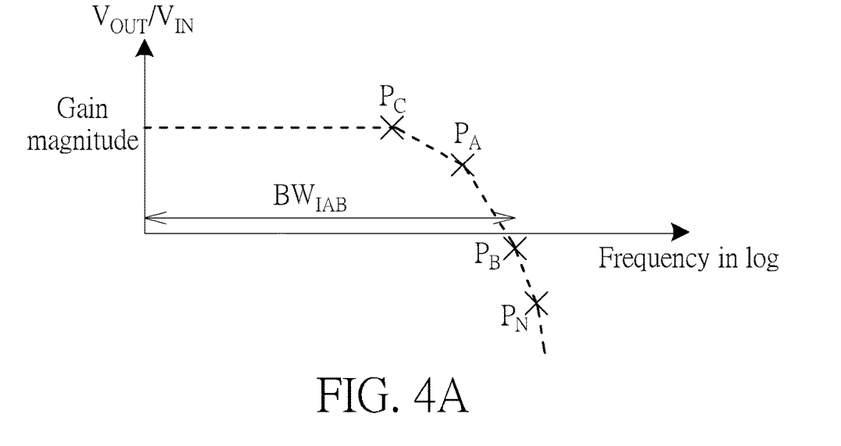
FIG. 4A is a Bode plot illustrating the gain magnitude of the impedance attenuated buffer.

Regarding the frequency response analysis of the impedance attenuated buffer 30, there are several poles $P_A$, $P_B$ and $P_C$ generated in the loop, as shown in FIG. 3. Since the pole $P_C$ is coupled between the gate terminal of the transistor M2 and the drain terminal of the transistor M4, it may be determined by the drain terminal of the transistor M4 having a large output impedance; hence, the pole $P_C$ may be the dominant pole having the lowest frequency. In addition, the output terminal of the impedance attenuated buffer 30 is connected to the gate terminal of the power MOSFET $M_p$, where the pole $P_A$ is mainly determined by the parasitic capacitance $C_{gs,Mp}$ and thus has a lower frequency; hence, the pole $P_A$ may be the first non-dominant pole. The $P_B$ is determined by the output impedance at the source terminal of the transistor M4 and may have a relatively high frequency. FIG. 4A is a Bode plot illustrating the gain magnitude of the impedance attenuated buffer 30. As shown in FIG. 4A, the two poles $P_A$ and $P_C$ with relatively low frequencies decrease the phase rapidly; this generates a low phase margin and thereby results in the stability problem.

Figure 4B:
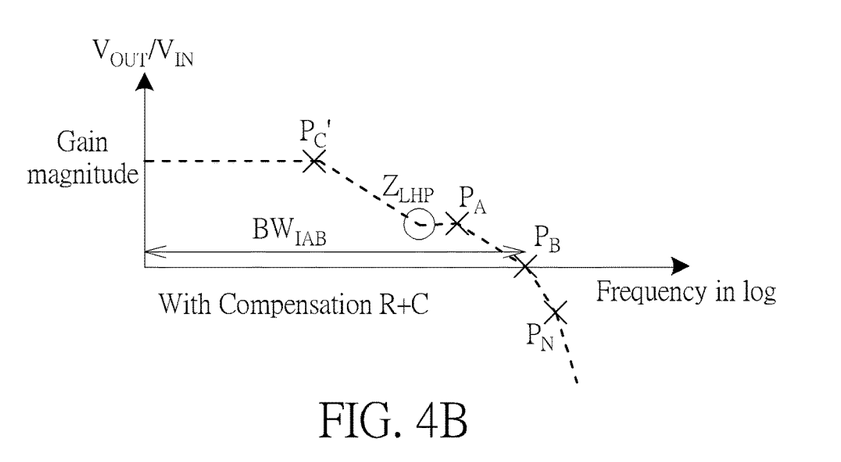
FIG. 4B is a Bode plot illustrating the gain magnitude of the impedance attenuated buffer with the compensation capacitor and resistor.

In order to solve the stability problem, a compensation resistor and a compensation capacitor may be coupled in series to the gate terminal of the transistor M2. FIG. 4B is a Bode plot illustrating the gain magnitude of the impedance attenuated buffer 30 with the compensation capacitor and resistor. As shown in FIG. 4B, the compensation capacitor pushes the pole $P_C$ to an even lower frequency, i.e., $P_C'$. The compensation resistor generates a zero $Z_{LHP}$ in a frequency approximately equal to the frequency of the pole $P_A$; hence, the influence of the pole $P_A$ may be canceled by the zero $Z_{LHP}$. In this embodiment, the closed-loop bandwidth $BW_{IAB}$ (e.g., unity gain bandwidth) may be designed to be near the frequency of the second non-dominant pole $P_B$, where the phase margin may be approximately equal to 45 degrees. In such a situation, the closed-loop bandwidth $BW_{IAB}$ is limited to the frequency of the second non-dominant pole $P_B$.

As mentioned above, the voltage regulator 10 is required to be configured with a large closed-loop bandwidth $BW_{REG}$, while the closed-loop bandwidth $BW_{IAB}$ in the source follower 202 should be at least 4 times greater than the closed-loop bandwidth $BW_{REG}$. However, the closed-loop bandwidth $BW_{IAB}$ is limited to the frequency of the second non-dominant pole $P_B$. Also, there are still several high frequency poles generated from the nodes out of the signal path. These poles, as denoted by $P_N$ in FIGS. 4A and 4B, may significantly decrease the phase near the upper bound of the closed-loop bandwidth $BW_{IAB}$; this results in insufficient phase margin if the closed-loop bandwidth $BW_{IAB}$ of the impedance attenuated buffer 30 needs to be further extended.

Figure 5:
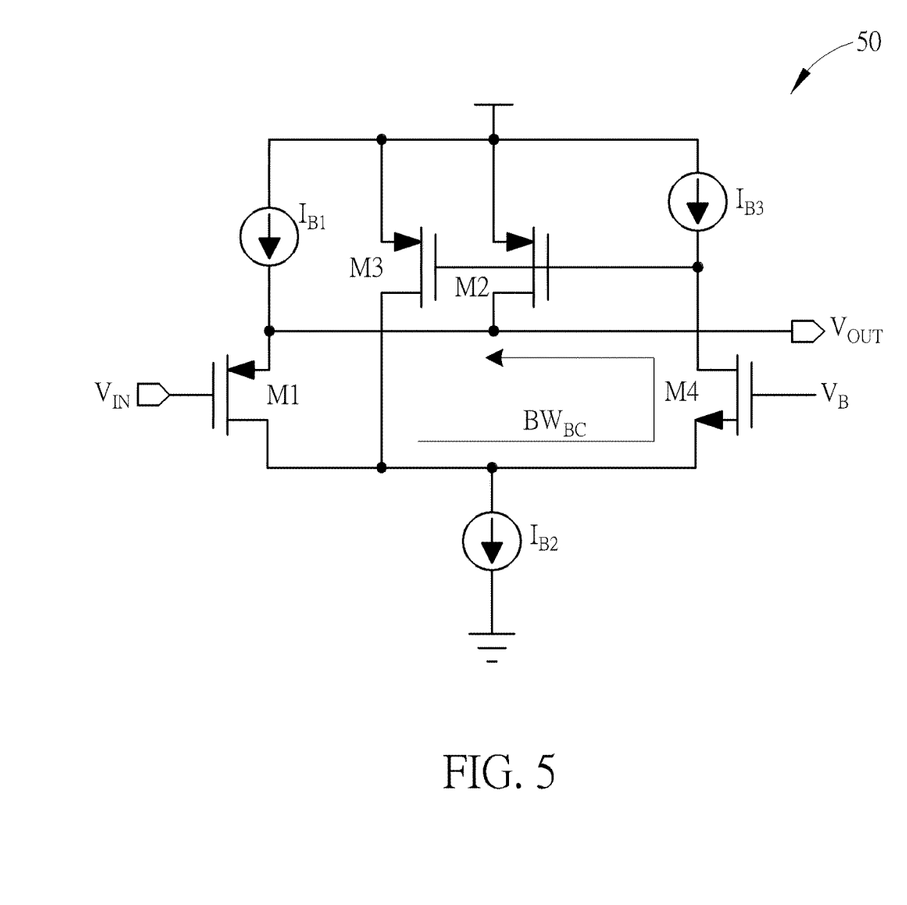
FIG. 5 is a schematic diagram of a buffer circuit according to an embodiment of the present invention.

Please refer to FIG. 5, which is a schematic diagram of a buffer circuit 50 according to an embodiment of the present invention. As shown in FIG. 5, the buffer circuit 50 includes transistors M1 and M2, a feed-forward circuit M3, a resistive bias circuit M4 and current sources $I_{B1}$, $I_{B2}$ and $I_{B3}$. The operations and functionalities of the transistors M1 and M2 and the resistive bias circuit M4 in the buffer circuit 50 are similar to those of the transistors M1, M2 and M4 in the impedance attenuated buffer 30, respectively. Therefore, these circuit elements are denoted by the same symbols. The current sources $I_{B1}$, $I_{B2}$ and $I_{B3}$ in the buffer circuit 50 are also similar to those in the impedance attenuated buffer 30, respectively. The buffer circuit 50 is different from the impedance attenuated buffer 30 in that, the buffer circuit 50 further includes the feed-forward circuit M3. In this embodiment, the feed-forward circuit M3 is implemented with a transistor, for providing a feed-forward path. In addition, the resistive bias circuit M4 may be implemented with a transistor receiving a bias voltage $V_B$. The buffer circuit 50 may replace the impedance attenuated buffer 30 to be incorporated as the source follower 202 in the voltage regulator 10.

In detail, the gate terminal of the transistor M1 is served as the input terminal of the buffer circuit 50, for being coupled to the output terminal of the operational amplifier 104 to receive the input voltage $V_{IN}$. The drain terminal of the transistor M1 is coupled to the source terminal of the transistor in the resistive bias circuit M4 (called the transistor M4 hereinafter for brevity). The gate terminal of the transistor M4 is coupled to a bias terminal for receiving the bias voltage $V_B$. The drain terminal of the transistor M4 is coupled to the gate terminal of the transistor M2. The drain terminal of the transistor M2 is coupled to the source terminal of the transistor M1. The drain terminal of the transistor M2 is served as the output terminal of the buffer circuit 50, for being coupled to the gate terminal of the power MOSFET $M_p$, to output the output voltage $V_{OUT}$ to control the power MOSFET $M_p$. The abovementioned connections of the transistor M1, the resistive bias circuit M4 and the transistor M2 form a closed-loop signal path. In addition, the gate terminal of the transistor in the feed-forward circuit M3 (called the transistor M3 hereinafter for brevity) is coupled to the gate terminal of the transistor M2, and the drain terminal of the transistor M3 is coupled to the drain terminal of the transistor M1. The feed-forward circuit M3 provides a feed-forward path between the gate terminal of the transistor M2 and the drain terminal of the transistor M1. Further, the current source $I_{B1}$ is coupled to the source terminal of the transistor M1, the current source $I_{B2}$ is coupled to the drain terminal of the transistor M1, the drain terminal of the transistor M3 and the source terminal of the transistor M4, and the current source $I_{B3}$ is coupled to the drain terminal of the transistor M4. These current sources $I_{B1}$-$I_{B3}$ aim at supplying currents for corresponding circuit elements.

In the buffer circuit 50, the transistor M1 is served as the main structure for the source follower since it receives the input voltage $V_{IN}$ via the gate terminal and outputs the output voltage $V_{OUT}$ via the source terminal. With the closed-loop signal path formed by the transistors M1, M2 and M4, a gain is provided with the amplification of gate-to-drain transition in the transistors M1 and M2, which increases the signal magnitude of the output voltage $V_{OUT}$ allowing the output voltage $V_{OUT}$ to respond rapidly with the input signal received by the buffer circuit 50. The resistive bias circuit M4 provides a common gate bias point which shifts the level of the signal. The feed-forward circuit M3 provides the feed-forward path, and the signal may pass through the feed-forward path, which generates a zero in the frequency response of the buffer circuit 50. In this embodiment, the transistor M3 receives the signal from its gate terminal and forwards the signal to its drain terminal, so as to realize the feed-forward path and thereby generate a zero. The zero, which is configured to be near the upper bound of the bandwidth, may increase the phase margin and thereby enhance the loop stability of the buffer circuit 50. With the improved phase margin and stability, the circuit design is more flexible since the closed-loop bandwidth $BW_{BC}$ of the buffer circuit 50 may be designed to be larger. With the larger closed-loop bandwidth $BW_{BC}$, the closed-loop bandwidth $BW_{REG}$ of the voltage regulator 10 may also be increased.

Figure 6:
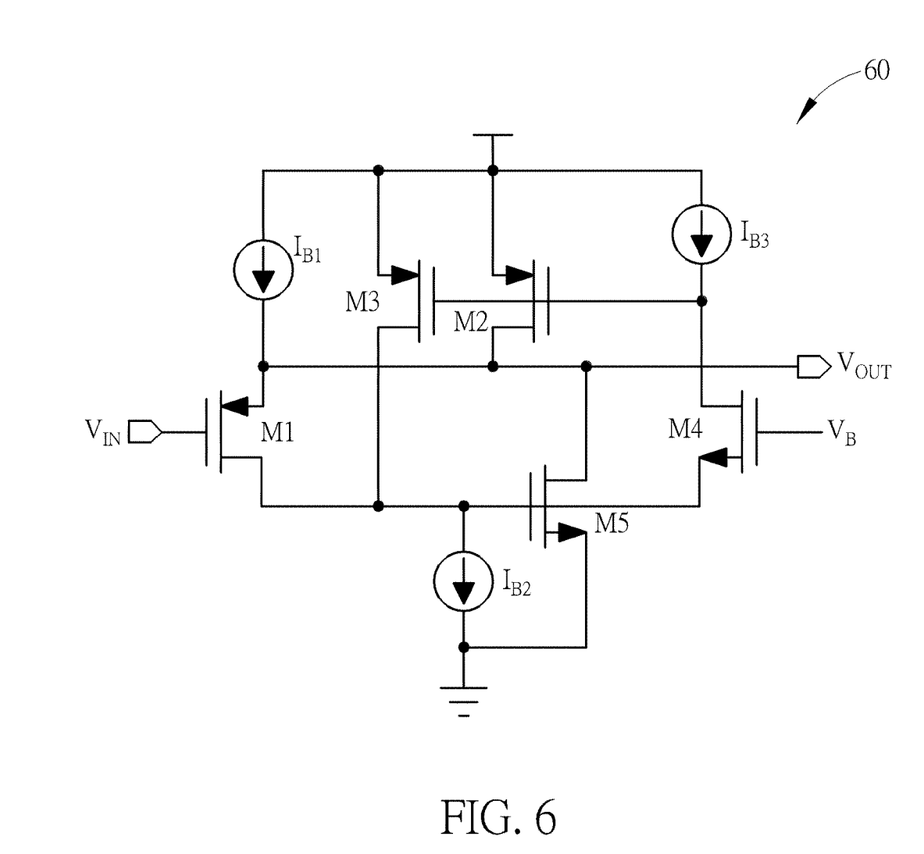
FIG. 6 is a schematic diagram of another buffer circuit according to an embodiment of the present invention.

Please refer to FIG. 6, which is a schematic diagram of another buffer circuit 60 according to an embodiment of the present invention. As shown in FIG. 6, the structure of the buffer circuit 60 is similar to the structure of the buffer circuit 50, and thus the circuit elements and signals having similar functions are denoted by the same symbols. The buffer circuit 60 is different from the buffer circuit 50 in that, the buffer circuit 60 further includes a transistor M5, which has similar functions as the transistor M5 in the impedance attenuated buffer 30. The transistor M5 together with the transistors M1, M2 and M4 forms the closed loop in the buffer circuit 60. In detail, the gate terminal the transistor M5 is coupled to the drain terminal of the transistor M1, the drain terminal of the transistor M5 is coupled to the output terminal of the buffer circuit 60, and the source terminal of the transistor M5 is coupled to the ground terminal. As mentioned above, the buffer circuit 60 may output the output voltage $V_{OUT}$ to the gate terminal of the power MOSFET $M_p$ in the voltage regulator 10. When the supply voltage $V_{REG}$ of the voltage regulator 10 drops, the transistor M5 is turned on to pull down the output voltage $V_{OUT}$, which in turn drives the power MOSFET $M_p$ to output more current to control the supply voltage $V_{REG}$ to return to its target level rapidly. More specifically, the input signal is amplified by the transistor M1 and then amplified by the transistor M5, so as to generate the output signal. These gain stage provides a fast response on the output terminal of the buffer circuit 60 to rapidly pull down the output voltage $V_{OUT}$. In a similar manner, when the supply voltage $V_{REG}$ of the voltage regulator 10 rises, the transistor M2 aims at pulling up the output voltage $V_{OUT}$, which in turn drives the power MOS- FET $M_p$ to output less current, to control the supply voltage $V_{REG}$ to return to its target level.

Figure 7:
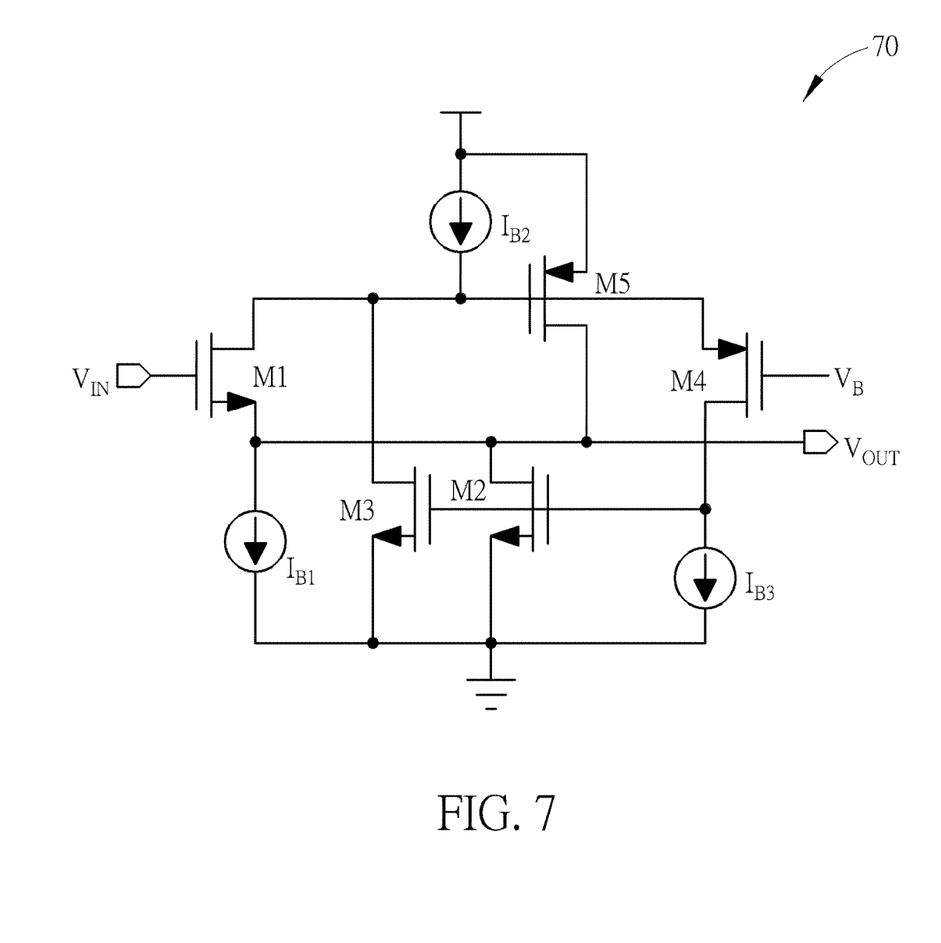
FIG. 7 is a schematic diagram of a buffer circuit with transistors having inverted polarities according to an embodiment of the present invention.

Note that the present invention aims at providing a buffer circuit to be implemented as a source follower for controlling the power transistor of a voltage regulator. Those skilled in the art may make modifications and alternations accordingly. For example, the feed-forward circuit of the present invention may be realized by other methods, e.g., a combination of multiple transistors and/or other circuit elements. As long as a feed-forward circuit is included in the loop of a buffer circuit so as to increase the phase margin and loop bandwidth, the buffer circuit should be included in the scope of the present invention, and the circuit structure of the buffer circuit may be realized in various manners. For example, the polarities of the transistors in the buffer circuit may be inverted without changing the functionality of the buffer circuit. In the above embodiment as shown in FIG. 6, the transistors M1-M3 are P-type metal-oxide semiconductor (PMOS) transistors and the transistors M4-M5 are N-type metal-oxide semiconductor (NMOS) transistors. In another embodiment, the transistors M1-M3 may be implemented as NMOS transistors and the transistor M4-M5 may be implemented as PMOS transistors, as the buffer circuit 70 shown in FIG. 7. In a similar manner, the buffer circuit 70 outputs the output voltage $V_{OUT}$ by receiving the input voltage $V_{IN}$, where the transistors M1, M5, M4 and M2 form a closed loop and the transistor M3 provides the feed-forward path.

Figure 8A:
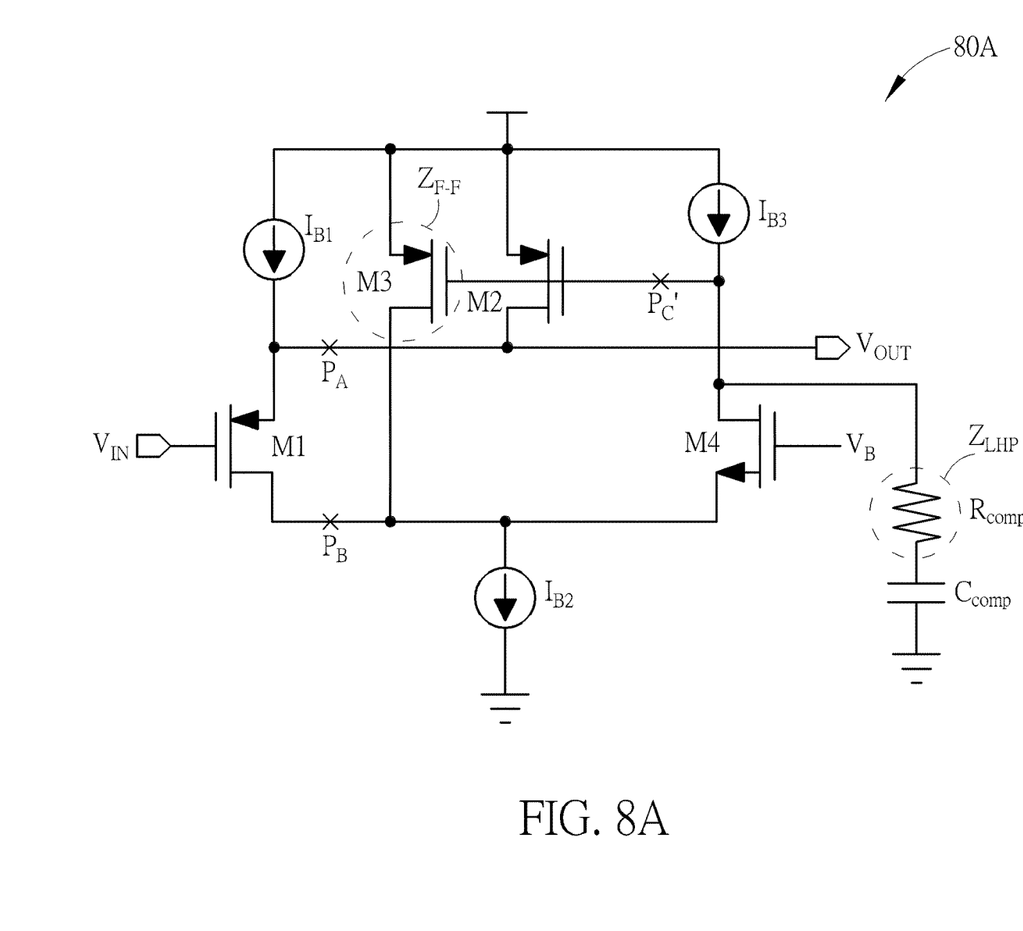
FIGS. 8A and 8B are schematic diagrams of buffer circuits according to embodiments of the present invention.
Figure 8B:
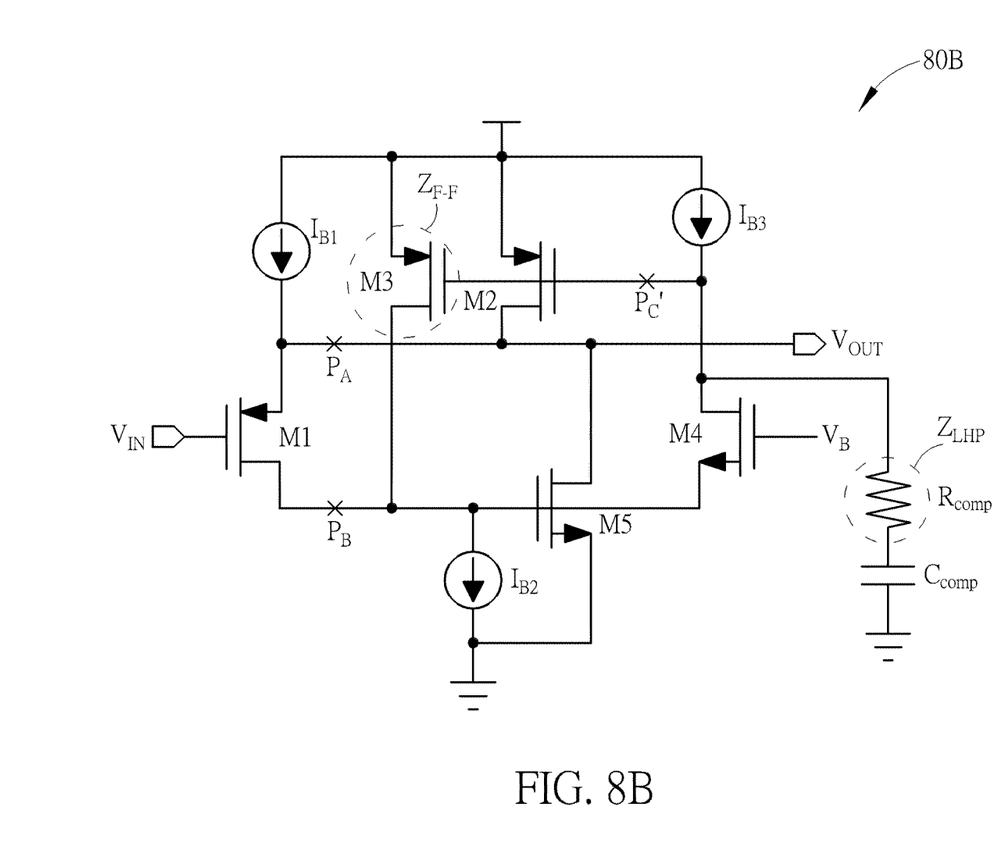

As mentioned above, in the impedance attenuated buffer 30, the stability may be improved by adding a compensation capacitor and a compensation resistor. Similar implementation is also feasible in each of the buffer circuits 50, 60 and 70. Please refer to FIGS. 8A and 8B, which are schematic diagrams of buffer circuits 80A and 80B according to embodiments of the present invention. The buffer circuit 80A in FIG. 8A is identical to the buffer circuit 50, where the only difference is that the buffer circuit 80A has a compensation capacitor $C_{comp}$ and a compensation resistor $R_{comp}$ coupled in series, which are coupled to the gate terminal of the transistor M2 (and may also be considered as being coupled to the gate terminal of the transistor M3 or the drain terminal of the transistor M4). The buffer circuit 80B in FIG. 8B is identical to the buffer circuit 60, where the only difference is that the buffer circuit 80B has a compensation capacitor $C_{comp}$ and a compensation resistor $R_{comp}$ coupled in series, which are coupled to the gate terminal of the transistor M2 (and may also be considered as being coupled to the gate terminal of the transistor M3 or the drain terminal of the transistor M4). The detailed operations of the buffer circuits 80A and 80B are similar to those in the buffer circuits 50 and 60, and will not be narrated herein.

Figure 9:
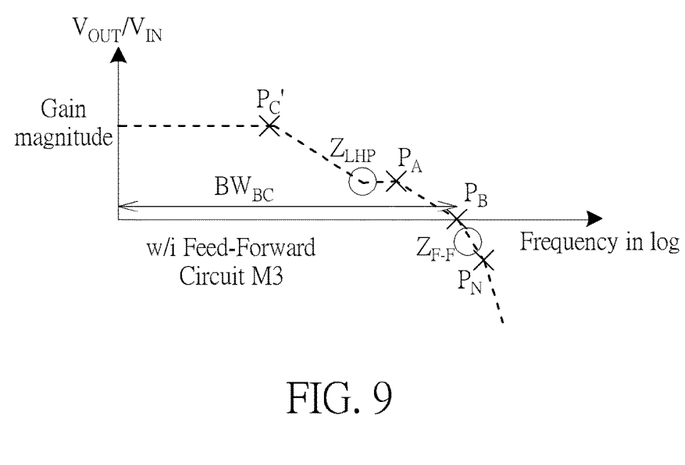
FIG. 9 is a Bode plot illustrating the gain magnitude of the buffer circuit shown in FIG. 8A or 8B.

Please refer to FIG. 9, which is a Bode plot illustrating the gain magnitude of the buffer circuit 80A or 80B. As shown in FIG. 9, the poles $P_A$, $P_B$ and $P_C'$ and the zero $Z_{LHP}$ are similar to those shown in FIG. 4B, where the compensation capacitor $C_{comp}$ pushes the original pole $P_C$ to an even lower frequency as $P_C'$, and the compensation resistor $R_{comp}$ generates the zero $Z_{LHP}$ for canceling the influence of the pole $P_A$. In addition, with the feed-forward circuit M3, a zero $Z_{F-F}$ is generated to cancel the influence of the pole $P_B$, so as to prevent the phase margin from falling rapidly at the frequency near the pole $P_B$. As a result, the closed-loop bandwidth $BW_{BC}$ of the buffer circuit 80A or 80B may be enhanced to be greater than the frequency of the pole $P_B$, while the phase margin may also be improved. In a simulation result, the impedance attenuated buffer 30 without a feed-forward circuit has the unity gain bandwidth equal to 4.46 MHz and the phase margin equal to 24 degrees. In comparison, in the buffer circuit 80A or 80B of the present invention where the feed-forward circuit M3 is included, the unity gain bandwidth is equal to 7.5 MHz and the phase margin is equal to 60 degrees. The higher phase margin provides a higher stability. The larger unity gain bandwidth provides a faster response speed of the buffer circuit. When the buffer circuit 80A or 80B is applied as the source follower 202 to be coupled to the gate terminal of the power MOSFET $M_p$, the closed-loop bandwidth $BW_{REG}$ may be larger due to the larger closed-loop bandwidth $BW_{BC}$, since the closed-loop bandwidth $BW_{BC}$ is required to be at least 4 times greater than the closed-loop bandwidth $R_{REG}$.

Figure 10A:
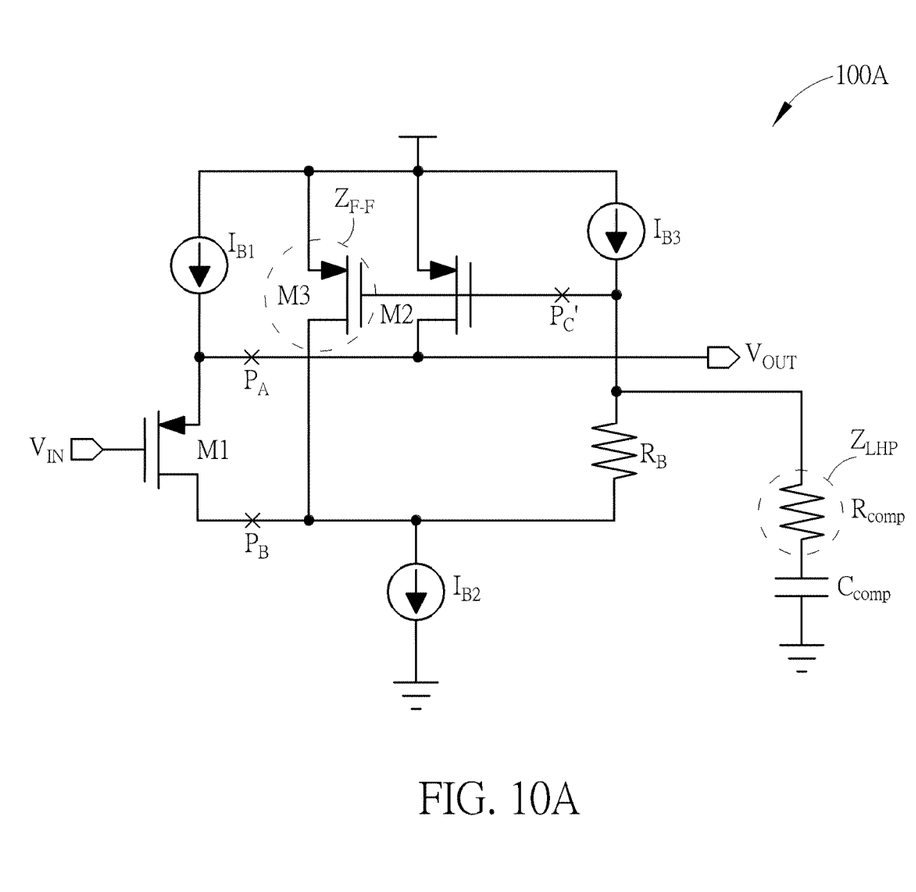
FIGS. 10A and 10B are schematic diagrams of buffer circuits according to embodiments of the present invention.
Figure 10B:
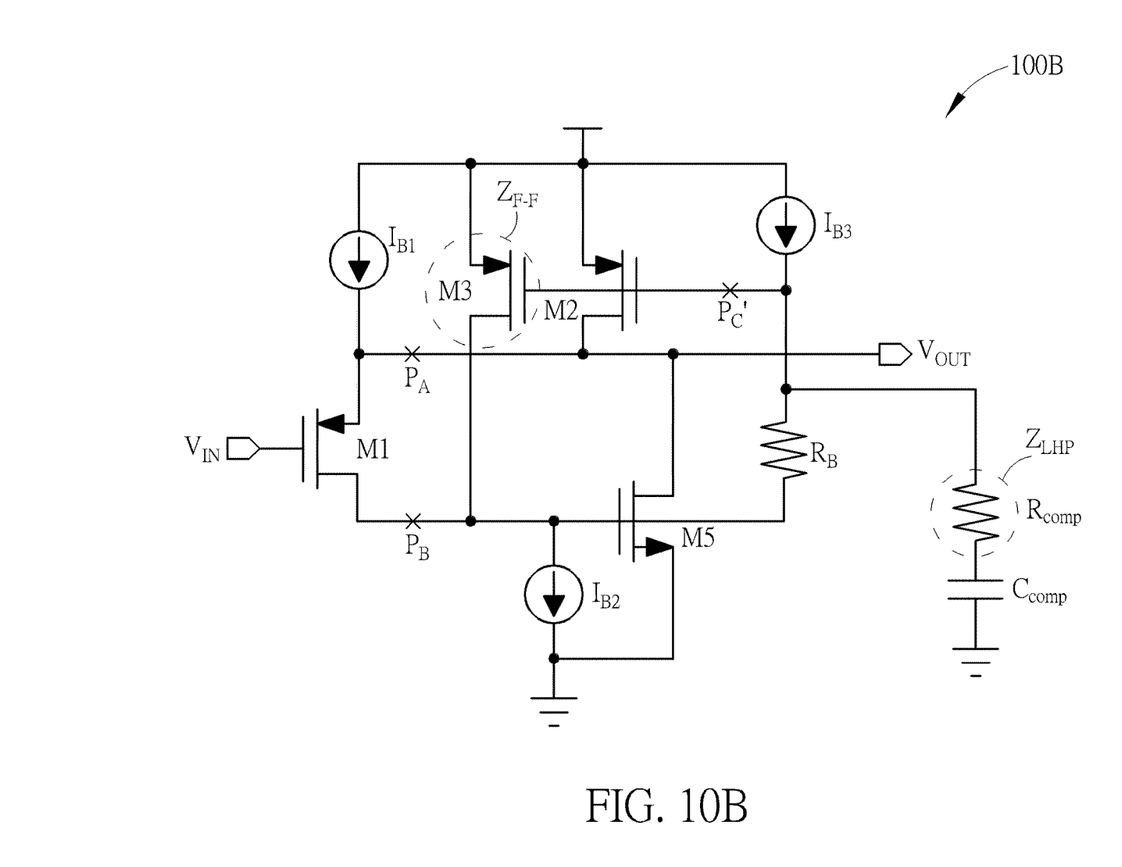

Please refer to FIGS. 10A and 10B, which are schematic diagrams of buffer circuits 100A and 100B according to embodiments of the present invention. The buffer circuits 100A and 100B are identical to the buffer circuits 80A and 80B, respectively, where the only difference is that the resistive bias circuit is implemented with a resistor $R_B$ in the buffer circuits 100A and 100B. As its name implies, the resistive bias circuit provides a resistance bias which may be implemented as a resistor or a transistor capable of providing an equivalent resistance.

To sum up, the present invention provides a buffer circuit used for a voltage regulator, for enhancing the bandwidth of the voltage regulator while maintaining the stability of the voltage regulator. The buffer circuit includes a feed-forward circuit, which is capable of generating a zero in the frequency response of the buffer circuit. The zero generated by the feed-forward circuit, which is near the upper bound of the bandwidth, may cancel a non-dominant pole to increase the phase margin and thereby enhance the loop stability of the buffer circuit. Therefore, when the buffer circuit is applied as the source follower coupled to the gate terminal of the power MOSFET, the closed-loop bandwidth of the voltage regulator may be larger due to the larger bandwidth of the buffer circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A buffer circuit, comprising:
a first transistor, having a first terminal, a second terminal and a third terminal, wherein the first terminal of the first transistor is served as an input terminal of the buffer circuit;
a second transistor, having a first terminal and a second terminal, wherein the second terminal of the second transistor is coupled to the third terminal of the first transistor and served as an output terminal of the buffer circuit;
a feed-forward circuit, having a first terminal and a second terminal, wherein the first terminal of the feed-forward circuit is coupled to the first terminal of the second transistor, and the second terminal of the feed-forward circuit is coupled to the second terminal of the first transistor; and
a resistive bias circuit, having a first terminal and a second terminal, wherein the first terminal of the resistive bias circuit is coupled to the second terminal of the first transistor, and the second terminal of the resistive bias circuit is coupled to the first terminal of the feed-forward circuit.

2. The buffer circuit of claim 1, further comprising:
a compensation resistor and a compensation capacitor, coupled in series to the first terminal of the second transistor.

3. The buffer circuit of claim 1, wherein the first terminal of the first transistor is a gate terminal of the first transistor, the second terminal of the first transistor is a drain terminal of the first transistor, and the third terminal of the first transistor is a source terminal of the first transistor.

4. The buffer circuit of claim 1, wherein the first terminal of the second transistor is a gate terminal of the second transistor, and the second terminal of the second transistor is a drain terminal of the second transistor.

5. The buffer circuit of claim 1, wherein the feed-forward circuit comprises a third transistor.

6. The buffer circuit of claim 1, wherein the resistive bias circuit comprises a fourth transistor or a resistor.

7. The buffer circuit of claim 1, further comprising:
a fifth transistor, having a first terminal and a second terminal, wherein the first terminal of the fifth transistor is coupled to the second terminal of the first transistor, and the second terminal of the fifth transistor is coupled to the output terminal of the buffer circuit.

8. The buffer circuit of claim 1, wherein the feed-forward circuit provides a feed-forward path between the first terminal of the second transistor and the second terminal of the first transistor.

9. The buffer circuit of claim 5, wherein the first terminal of the feed-forward circuit is a gate terminal of the third transistor, and the second terminal of the feed-forward circuit is a drain terminal of the third transistor.

10. The buffer circuit of claim 6, wherein the first terminal of the resistive bias circuit is a source terminal of the fourth transistor, and the second terminal of the resistive bias circuit is a drain terminal of the fourth transistor.

11. A voltage regulator, comprising:
a power transistor;
a voltage divider, coupled to the power transistor;
an operational amplifier, coupled to the voltage divider; and
a buffer circuit, coupled between an output terminal of the operational amplifier and a gate terminal of the power transistor, the buffer circuit comprising:
a first transistor, having a first terminal, a second terminal and a third terminal, wherein the first terminal of the first transistor is coupled to the output terminal of the operational amplifier;
a second transistor, having a first terminal and a second terminal, wherein the second terminal of the second transistor is coupled to the third terminal of the first transistor and the gate terminal of the power transistor;
a feed-forward circuit, having a first terminal and a second terminal, wherein the first terminal of the feed-forward circuit is coupled to the first terminal of the second transistor, and the second terminal of the feed-forward circuit is coupled to the second terminal of the first transistor; and
a resistive bias circuit, having a first terminal and a second terminal, wherein the first terminal of the resistive bias circuit is coupled to the second terminal of the first transistor, and the second terminal of the resistive bias circuit is coupled to the first terminal of the feed-forward circuit.

12. The voltage regulator of claim 11, wherein the buffer circuit further comprises:
a compensation resistor and a compensation capacitor, coupled in series to the first terminal of the second transistor.

13. The voltage regulator of claim 11, wherein the first terminal of the first transistor is a gate terminal of the first transistor, the second terminal of the first transistor is a drain terminal of the first transistor, and the third terminal of the first transistor is a source terminal of the first transistor.

14. The voltage regulator of claim 11, wherein the first terminal of the second transistor is a gate terminal of the second transistor, and the second terminal of the second transistor is a drain terminal of the second transistor.

15. The voltage regulator of claim 11, wherein the feed-forward circuit comprises a third transistor.

16. The voltage regulator of claim 11, wherein the resistive bias circuit comprises a fourth transistor or a resistor.

17. The voltage regulator of claim 11, wherein the buffer circuit further comprises:
a fifth transistor, having a first terminal and a second terminal, wherein the first terminal of the fifth transistor is coupled to the second terminal of the first transistor, and the second terminal of the fifth transistor is coupled to the gate terminal of the power transistor.

18. The voltage regulator of claim 11, wherein the feed-forward circuit provides a feed-forward path between the first terminal of the second transistor and the second terminal of the first transistor.

19. The voltage regulator of claim 15, wherein the first terminal of the feed-forward circuit is a gate terminal of the third transistor, and the second terminal of the feed-forward circuit is a drain terminal of the third transistor.

20. The voltage regulator of claim 16, wherein the first terminal of the resistive bias circuit is a source terminal of the fourth transistor, and the second terminal of the resistive bias circuit is a drain terminal of the fourth transistor.

* * * * *